US012689180B2

(12) United States Patent
Shirasaki

(10) Patent No.: US 12,689,180 B2
(45) Date of Patent: Jul. 21, 2026

(54) INSPECTION METHOD FOR SEMICONDUCTOR LASER DEVICE AND INSPECTION DEVICE FOR SEMICONDUCTOR LASER DEVICE

(71) Applicant: Mitsubishi Electric Corporation, Tokyo (JP)

(72) Inventor: Akio Shirasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1122 days.

(21) Appl. No.: 17/755,308

(22) PCT Filed: Jan. 9, 2020

(86) PCT No.: PCT/JP2020/000477
§ 371 (c)(1),
(2) Date: Apr. 26, 2022

(87) PCT Pub. No.: WO2021/140618
PCT Pub. Date: Jul. 15, 2021

(65) Prior Publication Data
US 2022/0376465 A1      Nov. 24, 2022

(51) Int. Cl.
*H01S 5/065* (2006.01)
*H01S 5/026* (2006.01)
*H01S 5/0683* (2006.01)

(52) U.S. Cl.
CPC .......... *H01S 5/0265* (2013.01); *H01S 5/0651* (2013.01); *H01S 5/0683* (2013.01); *H01S 2301/16* (2013.01)

(58) Field of Classification Search
CPC .................................................. H01S 5/0651
See application file for complete search history.

(56) References Cited

U.S. PATENT DOCUMENTS 6,222,202 B1 * 4/2001 Babic ................... H01S 5/0264
257/85
2003/0012244 A1 * 1/2003 Krasulick .............. B82Y 20/00
372/50.1
2015/0029512 A1 * 1/2015 Uchida .............. G01B 9/02091
356/479

FOREIGN PATENT DOCUMENTS

JP      H10-284780 A      10/1998
JP      2001-050859 A      2/2001
(Continued)

OTHER PUBLICATIONS

International Search Report issued in PCT/JP2020/000477; mailed Mar. 17, 2020.

*Primary Examiner* — Minsun O Harvey
*Assistant Examiner* — Fernanda Adriana Camacho Alanis
(74) *Attorney, Agent, or Firm* — Studebaker Brackett PLLC

(57) ABSTRACT

An inspection method for inspecting a semiconductor laser device integrated with a semiconductor laser, an electroabsorption modulator for input the output of the semiconductor laser, and a photodetector for detecting intensity of part of the laser light output from the semiconductor laser includes a step of acquiring a transverse-mode light output characteristic that is a relationship between an injection current to the semiconductor laser and the output of the photodetector; a step of applying a reverse bias voltage to the electroabsorption modulator and acquiring a total light output characteristic that is a relationship between the injection current to the semiconductor laser and a photocurrent output from the electroabsorption modulator; and a step of comparing the total light output characteristic with the transverse-mode light output characteristic, thereby to determine whether or not the semiconductor laser device under inspection is abnormal in the transverse mode.

17 Claims, 13 Drawing Sheets

(56) References Cited

FOREIGN PATENT DOCUMENTS

| | | | |
|---|---|---|---|
| JP | 2007-158204 | A | 6/2007 |
| JP | 2016-162798 | A | 9/2016 |

* cited by examiner

REAR END SURFACE                              FRONT END SURFACE

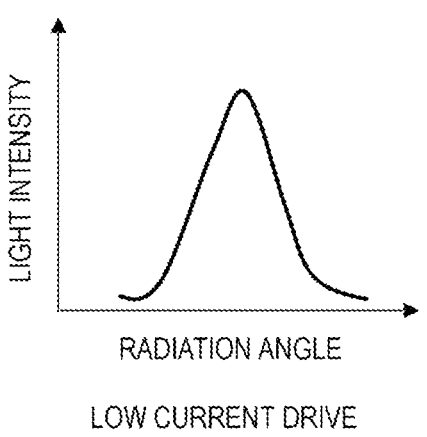
LOW CURRENT DRIVE
FIG. 4A
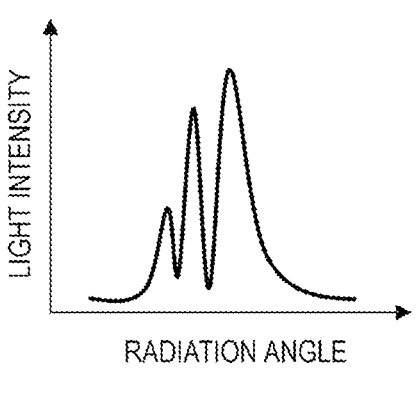
HIGH CURRENT DRIVE
FIG. 4B
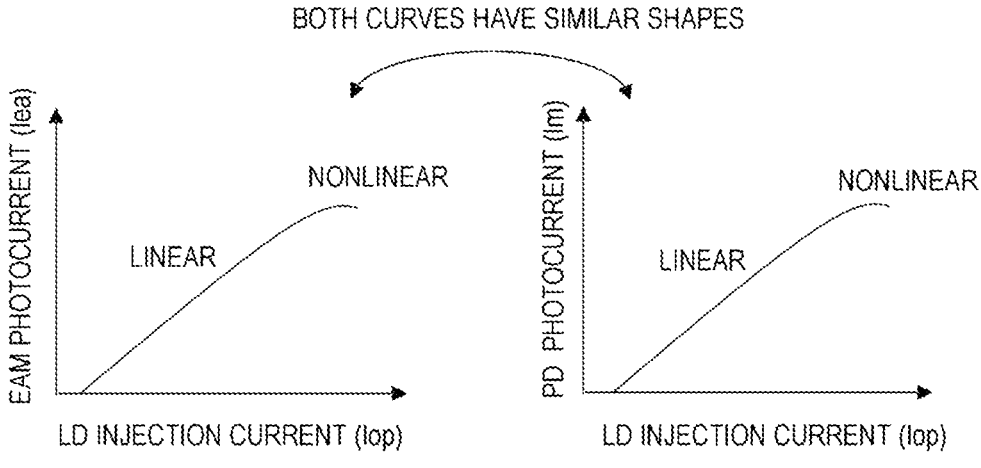
TOTAL LIGHT OUTPUT CHARACTERISTIC
(Iea – I CURVE)
FIG. 5A
TRANSVERSE-MODE LIGHT OUTPUT
CHARACTERISTIC (Im – I CURVE)
FIG. 5B TOTAL LIGHT OUTPUT CHARACTERISTIC
(Iea – I CURVE)

TRANSVERSE-MODE LIGHT OUTPUT
CHARACTERISTIC (Im – I CURVE)

TOTAL LIGHT OUTPUT CHARACTERISTIC
(Iea – I CURVE)

TRANSVERSE-MODE LIGHT OUTPUT
CHARACTERISTIC (Im – I CURVE)

TOTAL LIGHT OUTPUT CHARACTERISTIC
(Iea – I CURVE)

TRANSVERSE-MODE LIGHT OUTPUT
CHARACTERISTIC (Im – I CURVE)

DERIVATIVE VALUES OF Iea – I CURVE

DERIVATIVE VALUES OF Im – I CURVE

PRODUCT VALUES OF
DERIVATIVE VALUES OF Iea – I CURVE and
DERIVATIVE VALUES OF Im – I CURVE

INSPECTION METHOD FOR SEMICONDUCTOR LASER DEVICE AND INSPECTION DEVICE FOR SEMICONDUCTOR LASER DEVICE

TECHNICAL FIELD

The present application relates to an inspection method for semiconductor laser device and an inspection device for semiconductor laser device.

BACKGROUND ARTS

In optical communications, a semiconductor laser device that is capable of responding fast electrical signals is used as a light source for sending optical signals. The semiconductor laser device outputs a laser light intensity-modulated in response to the input electrical signals. The laser light is launched into an optical fiber via a condenser lens, to transmit the optical signals through the optical fiber. In an optical communication field, a single-mode optical fiber is generally used to keep quality of the optical signals. Hence, to obtain a strong optical coupling to the single mode optical fiber, the semiconductor laser provided in the semiconductor laser device is also designed to output a single-mode laser light.

In the semiconductor laser, a fluctuation called kink may sometimes occurs in the lasing mode with increasing injection current ($I_{op}$) due to its manufacturing variations. For example, a semiconductor laser having a gain waveguide structure is liable to become unstable in the transverse mode because of no refractive index difference for confinement of the light in the transverse direction. Increasing the $I_{op}$ to the semiconductor laser of such a structure distorts its gain distribution near the light emission region of intensive carrier consumption, so that the transverse mode becomes a multimode. Even though the transverse mode is a single mode during a low current drive, it becomes a multimode having a plurality of peaks during a high current drive. Varying from the single mode to the multimode causes variation in the far field pattern (FFP) of the laser beam. Variation in the FFP within a practical range of the $I_{op}$ brings variation in light coupling efficiency between the output of the semiconductor laser device and a single-mode optical fiber, thus deteriorating quality of the optical signals. For that reason, in the process of manufacturing the semiconductor laser device integrated with the semiconductor laser, it is desirable that a semiconductor laser device that is abnormal in the transverse mode be rejected beforehand as being unacceptable in a stage prior to the assembly step of mounting it into a semiconductor package by performing inspection for checking quality of the transverse mode immediately after completion of the wafer process. This allows for reducing waste of material costs and processing costs that would be incurred in the assembly step or the later test step.

Patent Document 1 discloses a technique for detecting the variation in the transverse mode as a means of rejecting such a semiconductor laser that is abnormal in the transverse mode, by disposing a photodetector so as to receive part of the divergent light emitted from the semiconductor laser and by measuring the dependency of the output light on the $I_{op}$ (P-I curve). The photodetector receives only part of the divergent light emitted from the semiconductor laser. Accordingly, when measuring the semiconductor laser being stable in the transverse mode, a linear P-I curve is obtained; however, when measuring the semiconductor laser being unstable in the transverse mode, a nonlinear P-I curve is obtained because the ratio of the amount of received light to that of the total emitted light varies, thus being able to detect variation in the FFP.

PRIOR ART DOCUMENT

Patent Document

Patent Document 1: JP1998-284780A

SUMMARY OF THE INVENTION

Problem that the Invention is to Solve

In the method disclosed in Patent Document 1 of determining the semiconductor laser being unstable and abnormal in the transverse mode, the inspection device needs the photodetector disposed so as to receive part of the light emitted from the semiconductor laser. For that reason, the semiconductor laser device under inspection needs to be disposed in a position with a certain relation to the photodetector, thereby causing the inspection procedure to be complicated. Moreover, since some semiconductor laser, although its transvers mode remains in a single mode, shows no perfect linear dependency of the output light on the $I_{op}$, it may in some cases be impossible to precisely determine the semiconductor laser device to be abnormal in the transverse mode only from a P-I curve of part of the divergent light.

The present application discloses a technology for resolving the above-described problems and aims at providing an inspection method for semiconductor laser device and an inspection device for semiconductor laser device that are capable of determining precisely a semiconductor laser device that is abnormal in the transverse mode.

Means for Solving the Problem

An inspection method for semiconductor laser device disclosed in the present application adapted to inspect a semiconductor laser device integrated with a semiconductor laser, an electroabsorption modulator formed to input an output of the semiconductor laser, and a photodetector formed to detect a laser light intensity of part of a laser light output from the semiconductor laser, the inspection method includes a step of acquiring a transverse-mode light output characteristic that is a relationship between an injection current to the semiconductor laser and an output of the photodetector; a step of applying a reverse bias voltage to the electroabsorption modulator and acquiring a total light output characteristic that is a relationship between the injection current to the semiconductor laser and a photocurrent output from the electroabsorption modulator; and a step of comparing the total light output characteristic with the transverse-mode light output characteristic, thereby to determine whether or not the semiconductor laser device under inspection is abnormal in the transverse mode.

An inspection device for semiconductor laser device disclosed in the present application configured to inspect a semiconductor laser device integrated with a semiconductor laser, an electroabsorption modulator formed to input an output of the semiconductor laser, and a photodetector formed to detect a laser light intensity of part of a laser light output from the semiconductor laser, the inspection device includes a semiconductor laser power source configured to supply an injection current to the semiconductor laser; an electroabsorption modulator power supply configured to supply a reverse bias voltage to the electroabsorption modulator; a photodetector power supply configured to supply a reverse bias voltage to the photodetector, and an inspection controller configured to control the semiconductor laser power supply, the electroabsorption modulator power supply, and the photodetector power supply to acquire a transverse-mode light output characteristic that is a relationship between the injection current to the semiconductor laser and an output of the photodetector and to acquire a total light output characteristic that is a relationship between the injection current to the semiconductor laser and a photocurrent output from the electroabsorption modulator, to compare the total light output characteristic with the transverse-mode light output characteristic, and thereby to determine whether or not the semiconductor laser device under inspection is abnormal in the transverse mode.

A second inspection method for semiconductor laser device disclosed in the present application adapted to inspect a semiconductor laser device integrated with a semiconductor laser and an electroabsorption modulator formed to input an output of the semiconductor laser, the inspection method includes a step of acquiring a transverse-mode light output characteristic that is a relationship between an injection current to the semiconductor laser and an output of a photodetector detecting a laser light intensity of part of a laser light output from the semiconductor laser device under inspection; a step of applying a reverse bias voltage to the electroabsorption modulator and acquiring a total light output characteristic that is a relationship between the injection current to the semiconductor laser and a photocurrent output from the electroabsorption modulator; and a step of comparing the total light output characteristic with the transverse-mode light output characteristic, thereby to determine whether or not the semiconductor laser device under inspection is abnormal in the transverse mode.

A third inspection method for semiconductor laser device disclosed in the present application adapted to inspect a semiconductor laser device provided with a semiconductor laser, the inspection method includes a step of acquiring a transverse-mode light output characteristic that is a relationship between an injection current to the semiconductor laser and an output of a photodetector detecting a laser light intensity of part of a laser light output from the semiconductor laser device under inspection; a step of acquiring a total light output characteristic that is a relationship between the injection current to the semiconductor laser and an output of another photodetector detecting a total laser light intensity of the laser light output from the semiconductor laser device under inspection; and a step of comparing the total light output characteristic with the transverse-mode light output characteristic, thereby to determine whether or not the semiconductor laser device under inspection is abnormal in the transverse mode.

Advantageous Effect of the Invention

According to the present application, an advantageous effect is brought about that enables an inspection method for semiconductor laser device and an inspection device for semiconductor laser device to be provided that precisely determine a semiconductor laser device which varies in the transverse mode.

BRIEF DESCRIPTION OF THE DRAWINGS

FIGS. 4A and 4B are graphs showing radiation angle characteristics of the laser light of the semiconductor laser device being abnormal in the transverse mode;

FIGS. 5A and 5B are graphs showing a total light output characteristic and a transverse-mode light output characteristic of the semiconductor laser device being normal in the transverse mode;

DETAILED DESCRIPTION OF THE INVENTION

Embodiment 1

Figure 1:
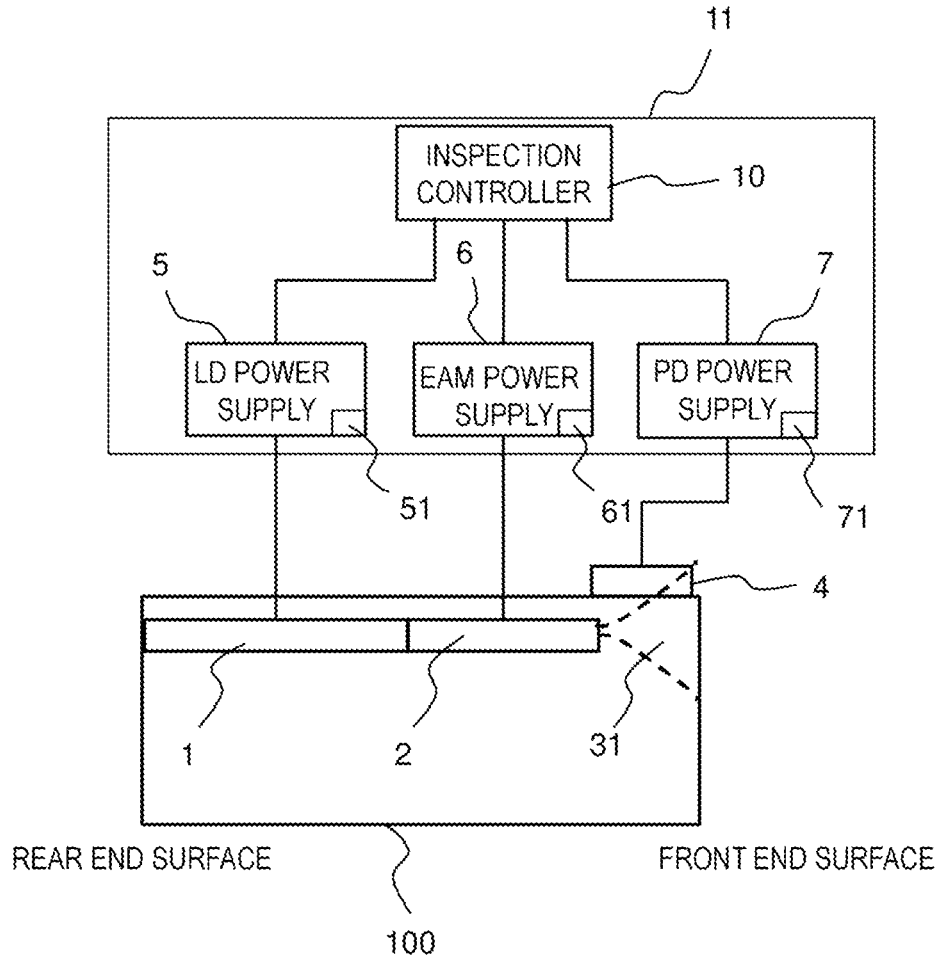
FIG. 1 is a schematic diagram showing a configuration of an inspection device for semiconductor laser device and a semiconductor laser device under inspection, according to Embodiment 1.
Figure 2:
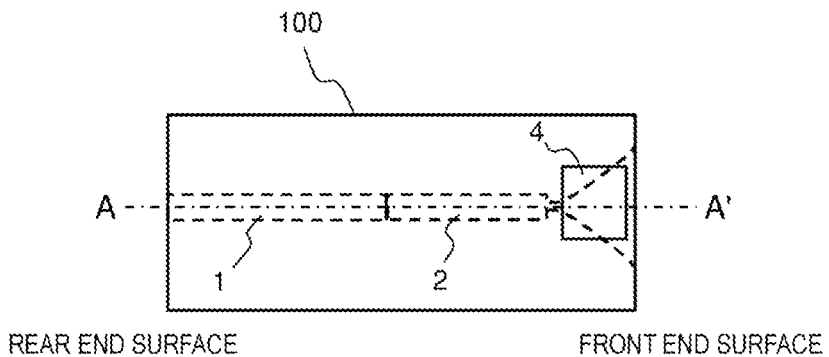
FIG. 2 is a top view of the semiconductor laser device under inspection by the inspection device, according to Embodiment 1.

FIG. 1 is a schematic diagram showing a configuration of an inspection device 11 for semiconductor laser device and a semiconductor laser device 100 under inspection, according to Embodiment 1. The inspection device 11 is illustrated by the block diagram, and the semiconductor laser device 100 is illustrated by the schematic sectional side view. FIG. 2 shows a top view of the semiconductor laser device 100. Note that the semiconductor laser device 100 shown in FIG. 1 is a cross-sectional view taken along the line A-A' in FIG. 2. The semiconductor laser device 100 is integrated monolithically with a semiconductor laser (also referred to as "LD") 1 and an electroabsorption modulator (also referred to as "EMA") 2, and their both optical waveguides are coupled to each other. Consequently, the laser light output from the LD 1 is introduced into the EAM 2 with low loss. Moreover, a window structure 31 having a refractive index lower than that of the EAM 2 is formed near the output side of the EAM 2, i.e., the chip end (front end surface) of the EAM 2. The laser light output from the LD 1 passes through the EAM 2 and radiates while diverging to the window structure 32. A photodetector (also referred to as "PD") 4, which is a light monitor, is formed near the window structure 31 so as to receive part of the divergent light.

The EAM 2 and the PD 4 absorb the incident light by being supplied with reverse bias voltages, to output photocurrents, respectively. Hereinafter, the photocurrent output from the EAM 2 is designated at $I_{ea}$ and that output from the PD 4 is designated at $I_m$. The inspection device 11 is provided with an LD (semiconductor laser) power supply 5 for feeding an injection current to the LD 1, an EAM (electroabsorption modulator) power supply 6 for supplying the reverse bias voltage to the EAM 2, and a PD (photodetector) power supply 7 for supplying the reverse bias voltage to the PD 4. The LD power supply 5 is provided with a current detector 51 for detecting the injection current $I_{op}$, the current flowing to the LD 1, and the EAM power supply 6 is provided with a photocurrent detector 61 for detecting the $I_{ea}$. Moreover, the PD power supply 7 is provided with a photocurrent detector 71 for detecting the $I_m$. It goes without saying that the current detector 51, the photocurrent detector 61, and the photocurrent detector 71 may be provided separately from the respective power supplies. The inspection device 11 is further provided with an inspection controller 10 for controlling the LD power supply 5, the EMA power supply 6, and the PD power supply 7, to acquire data of the $I_{op}$, data of the $I_{ea}$, and data of the $I_{op}$, respectively.

Ordinarily, the EAM 2 and the PD 4 are designed to output the photocurrents proportional to the light powers respectively input thereto. Accordingly, increasing linearly the light powers incident to the EAM 2 and the PD 4 also increases linearly the photocurrents $I_{ea}$ and $I_m$ output from the both.

Since the optical waveguides of the EAM 2 and the LD 1 are formed continuously and the both are coupled to each other with low loss, the EAM 2 absorbs most of the laser light output from the LD 1. On the other hand, the PD 4 since it receives part of laser light diverging in the window structure 31, absorbs only part of the transverse-mode laser light output from the LD 1.

Figure 3A:
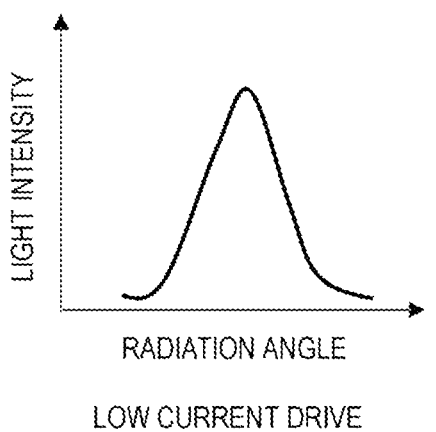
FIGS. 3A and 3B are graphs showing radiation angle characteristics of the laser light of the semiconductor laser device being normal in the transverse mode.
Figure 3B:
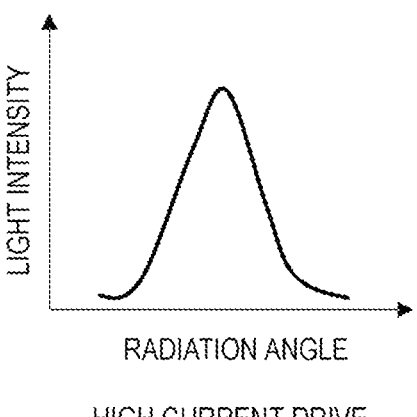

FIGS. 3A and 3B respectively show radiation angle characteristics of the output laser light during a low current drive and a high current drive in a case of the semiconductor laser device being normal in the transverse mode, in other words, the transverse mode do not vary with the $I_{op}$. In the case of the normal transverse mode, neither variation in the radiation angle characteristics nor variation in the FFP occur during the low current drive and the high current drive. FIGS. 4A and 4B respectively show radiation angle characteristics of the output laser light during a low current drive and a high current drive in a case of the semiconductor laser device being abnormal in the transverse mode, in other words, the transverse mode varying with the $I_{op}$. In the case of the abnormal transverse mode, although the transverse mode is a single mode during the low current drive, it becomes a multimode during the high current drive and the light radiation pattern varies from that during the low current drive, thus resulting in variation in the FFP.

FIGS. 5A and 5B respectively show dependency of the $I_{ea}$ on the $I_{op}$ (hereinafter, referred to as "$I_{ea}$-I curve" or "total light output characteristic") and dependency of the $I_m$ on the $I_{op}$ (hereinafter, referred to as "$I_m$-I curve" or "transverse-mode light output characteristic") in a case of the transverse mode being normal. In the case of the transverse mode not varying with the $I_{op}$, the $I_{ea}$-I curve and the $I_m$-I curve similar to each other are obtained because of no change in the ratio of the light received by the EAM 2 to the total output laser light and in the ratio of the light received by the PD 4 thereto. While the $I_{ea}$-I curve and the $I_m$-I curve in FIGS. 5A and 5B show as an example the emission efficiency of a semiconductor laser that saturates in a high current range, both curves are linear in the low current range and nonlinear in the high current range and have similar shapes.

Figures 6A, 6B:
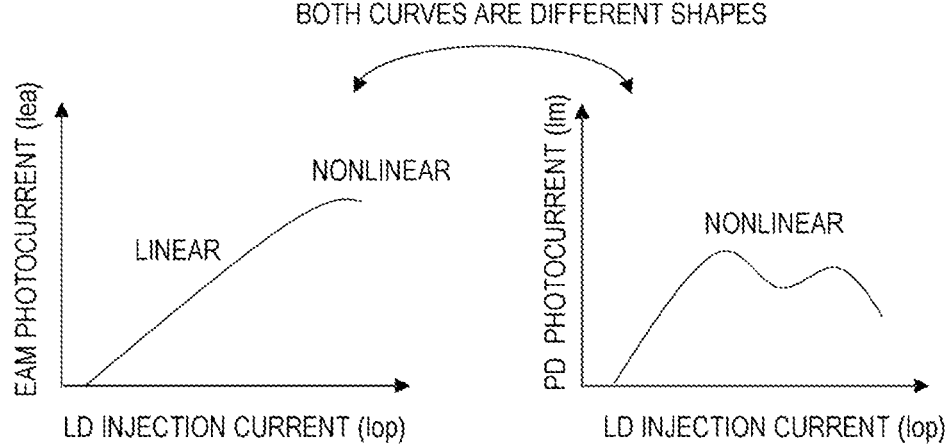
FIGS. 6A and 6B are graphs showing a total light output characteristic and a transverse-mode light output characteristic of the semiconductor laser device being abnormal in the transverse mode.

FIGS. 6A and 6B respectively show an example of an $I_{ea}$-I curve and an $I_m$-I curve in a case of the transverse mode being abnormal. Since the EAM 2 receives most of the transverse-mode laser light, even when the transverse mode varies, change in the ratio of the laser light received by the EAM 2 to the total laser output is small. On the other hand, since the PD 4 receives only part of the transverse-mode laser light, variation in the transverse mode varies largely the ratio of the laser light received by the PD 4 to the total laser output. Accordingly, the $I_{ea}$-I curve and the $I_m$-I curve different in shape are obtained. The $I_{ea}$-I curve and the $I_m$-I curve in FIGS. 6A and 6B show that the emission efficiency of the LD 1 saturates in a high current range as with FIGS. 5A and 5B. While the $I_{ea}$-I curve shown in FIG. 6A has a nonlinear shape only in the high current range as with FIG. 5A, the $I_m$-I curve shown in FIG. 6B exhibits a non-linearity in a lower current range; accordingly, both curves are different in shape from each other.

From the above, both of the $I_{ea}$-I curve and the $I_m$-I curve are measured to determine the element exhibiting a large difference between both curves to be abnormal in the transverse mode, thereby being able to reject the semiconductor laser device as being abnormal in the transverse mode, i.e., the transverse mode varies with the $I_{op}$.

Figure 7:
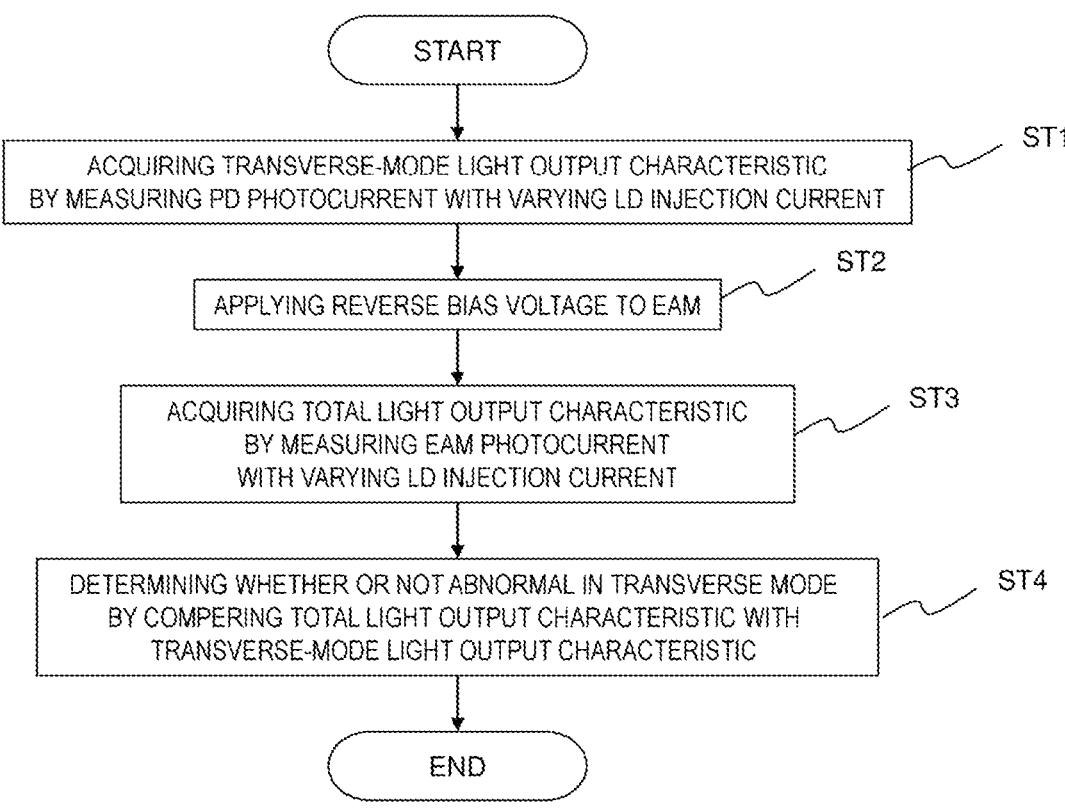
FIG. 7 is a flow diagram for explaining a procedure of an inspection method for semiconductor laser device according to Embodiment 1.

FIG. 7 is a flow diagram collectively showing an inspection method for semiconductor laser device according to Embodiment 1. The semiconductor laser device 100 shown in FIG. 1 and FIG. 2 is the inspection object. First, the inspection controller 10 measures the photocurrent $I_m$, the output of the PD 4 while varying the injection current $I_{op}$ to LD 1 by controlling the LD power supply, to acquire the $I_m$-I curve, the transverse-monde light output characteristic (Step ST1). At this time, no reverse bias voltage or a reverse bias voltage such a level not to largely absorb the laser light is applied to the EAM 2 for it to be in the condition of passing the laser light therethrough. Next, the inspection controller 10 controls the EAM power supply 6 to apply to the EAM 2 a reverse bias voltage such a level to absorb the light (Step ST2). Under the condition of applying the reverse bias voltage to the EAM 2, the inspection controller 10 measures the photocurrent $I_{ea}$, the output of the EAM 2, to acquire the $I_{ea}$-I curve, the total light output characteristic while varying the injection current $I_{op}$ to the LD 1 by controlling the LD power supply 5 (Step ST3). Next, the inspection controller 10 compares the acquired transverse-mode light output characteristic with the acquired total light output characteristic, thereby to determine whether or not the LD 1 of the semiconductor laser device under inspection is abnormal in the transverse mode (Step ST4). Note that Step ST2 and Step ST3 may be performed before Step ST1. In this case, it is needless to say that during performance of the Step ST1, the EAM 2 is kept in the condition that no reverse bias voltage or the bias voltage such the level not to absorb largely the laser light is applied to pass the laser light through the EAM 2.

Figure 15:
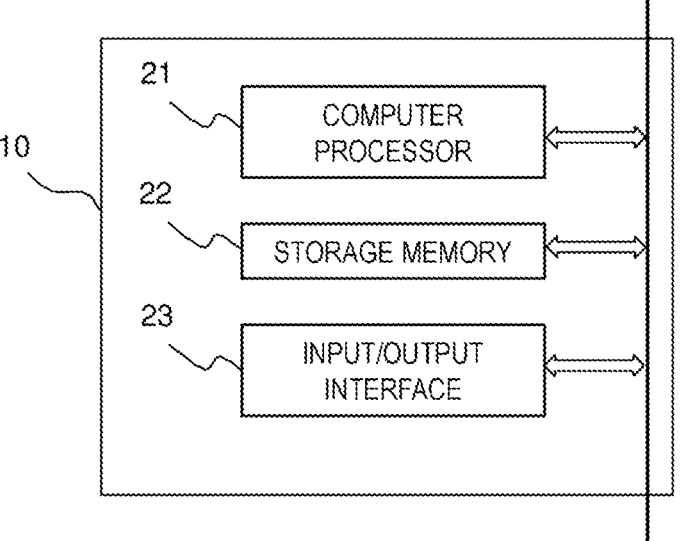
FIG. 15 is a block diagram showing an example of a hardware configuration of an inspection controller of the present application.

Each of the above steps can be actually implemented by the inspection controller 10 provided with, for example, a computer processor 21, a storage memory 22, and an input/output interface 23 as shown in FIG. 15, in which the computer processor 21 executes a program stored in the storage memory 22. Specifically, the inspection controller 10 determines abnormality in the transverse mode by sending control signals to the respective power supplies via the input/output interface 23 and acquiring data such as each current value.

As described above, it is possible to precisely determine whether or not the LD 1 of the semiconductor laser device 100 under inspection is abnormal in the transverse mode using the inspection method shown in FIG. 7 with the inspection device for semiconductor laser device shown in FIG. 1. In particular, the transverse-mode light output characteristic is acquired by measuring the intensity of part of the laser light output from the LD 1 with the PD 4 formed in the semiconductor laser device 100 and the total light output characteristic corresponding to the total output of the laser light is acquired by means of the EAM 2. Consequently, the inspection device needs no use of an additional photodetector. In a case of the LD 1 being an element normal in the transverse mode and the semiconductor laser device integrated with the semiconductor laser exhibiting an $I_{ea}$-I curve, i.e., a non-linear total light output characteristic even outside the saturation range, if the transverse mode is determined to be normal or abnormal only from the transverse-mode light output characteristic, the semiconductor laser device might be determined to be abnormal in the transverse mode. However, the transverse mode can be precisely determined to be abnormal or not even for such the semiconductor laser device by comparing the total light output characteristic with the transverse-mode light output characteristic.

Embodiment 2

Figure 8:
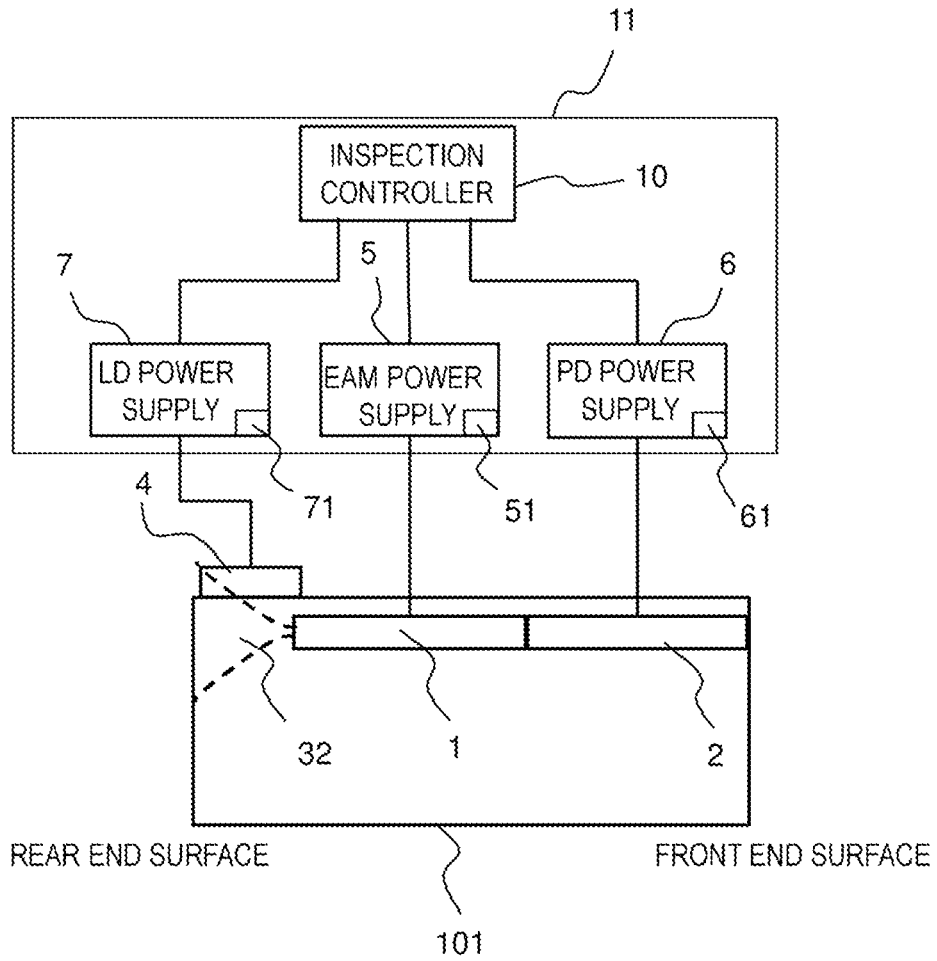
FIG. 8 is a schematic diagram showing a configuration of an inspection device for semiconductor laser device and a semiconductor laser device under inspection, according to Embodiment 2.

FIG. 8 is a schematic diagram showing a configuration of an inspection device 11 for semiconductor laser device and a semiconductor laser device 101 under inspection, according to Embodiment 2. The configuration of the inspection device 11 of Embodiment 2 is the same as that of Embodiment 1. The semiconductor laser device 101 under inspection is integrated monolithically with the LD 1 and the EAM 2 and their both waveguides are coupled to each other with low loss. Moreover, a window structure 32 having a refractive index lower than that of the LD 1 is formed near the chip end (rear end surface) of the LD 1. The laser light output from the LD 1 radiates while diverging to the window structure 32. The PD 4 is formed near the window structure 32 so as to receive part of the divergent light.

Also in Embodiment 2, while the EAM 2 receives most of the transverse-mode laser light output from the LD 1, the PD 4 receives only part of the transverse-mode laser light. Hence, both of the $I_{ea}$-I curve and the $I_m$-I curve are measured as with Embodiment 1, and if both curves are different largely from each other, the semiconductor laser device exhibiting such curves is determined to be abnormal in the transverse mode. Thus, the semiconductor laser device can be rejected as being abnormal in the transverse mode, i.e. the transverse mode varies with the $I_{op}$. The procedure of the inspection method according to Embodiment 2 is the same as that shown in FIG. 7.

Here, a description is made of a merit of the semiconductor laser device 101 under inspection by the inspection device according to Embodiment 2 over the semiconductor laser device 100 under inspection by the inspection device according to Embodiment 1. The semiconductor laser device 100 under inspection in Embodiment 1 is configured such that the PD 4 receives the output light of the EAM 2, thus posing a problem of complicating auto power control (APC). The APC is to take feedback to the injection current to the LD 1 so as to keep constant the photocurrent, i.e., the amount of received light output from the monitor. This control enables prevention of time-dependent variation in intensity of the optical signals output from the LD 1. In a case of incorporating the semiconductor laser device into an optical communication system, the semiconductor laser device does not always output optical signals but may sometimes pause in its operation depending on timing. At the pause, applying to the EAM 2 an electrical signal for reducing intensity of an optical signal to zero drops steeply the photocurrent (the amount of received light) of the PD 4 of the semiconductor laser device 100 under inspection in Embodiment 1. Hence, a problem is conceivable that the injection current to the LD 1 is thereby increased steeply by the APC and the LD 1 thereby fails. To avoid the problem, a control is needed that performs an action of stopping simultaneously not only the EAM 2 but also the LD 1 at the pause. In the semiconductor laser device 101 under inspection in Embodiment 2, on the other hand, since the PD 4 directly receives the output light of the LD 1, although an electrical signal for the pause is applied to the EAM 2, the amount of light received by the PD 4 does not change and the injection current to the LD 1 does not change steeply, thus not raising the above-described problem. Consequently, a simple APC can be applied.

Since the semiconductor laser device 100 described in Embodiment 1 and the semiconductor laser device 101 described in Embodiment 2 both are configured such that the PD 4 detects part of the laser light having the spatial distribution caused by the transverse mode of the laser light output from the LD 1, variation in the transverse mode can be detected by the PD 4. Consequently, the semiconductor laser device 100 of Embodiment 1 and the semiconductor laser device 101 of Embodiment 2 both can be the inspection objects of the inspection device 11 for semiconductor laser device and the inspection method for semiconductor laser device described in embodiment 1.

Embodiment 3

Figure 9A:
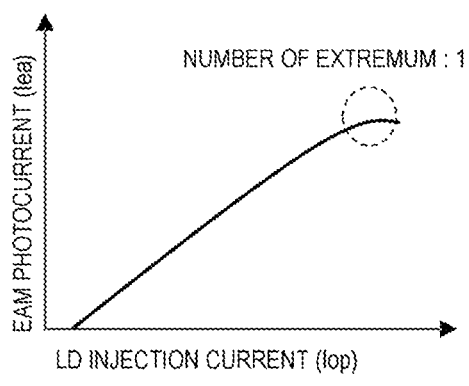
FIGS. 9A and 9B are graphs for explaining an inspection method for semiconductor laser device according to Embodiment 3.
Figure 9B:
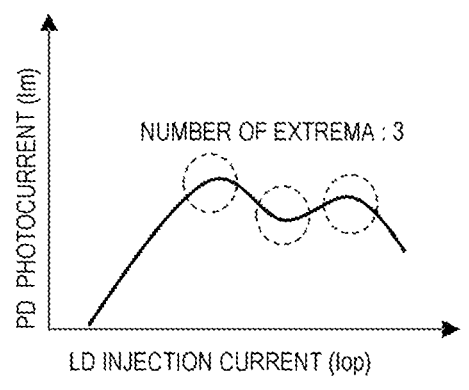

Embodiments 3 to 5 describe specific methods of determining the semiconductor laser device being abnormal in the transverse mode. FIGS. 9A and 9B are graphs for explaining an inspection method for semiconductor laser device according to Embodiment 3, in which an $I_{ea}$-I curve (FIG. 9A) and an $I_m$-I curve (FIG. 9B) are shown that are acquired when the semiconductor laser device under inspection is in an unstable and abnormal transverse mode. As shown in FIG. 9A, a local extremum due to the saturation appears in the $I_{ea}$-I curve, the total light output characteristic. On the other hand, a plurality of local extrema due to the transverse mode becoming unstable may sometimes appear in the $I_m$-I curve, the transverse-mode light output characteristic, as shown in FIG. 9B. When the transverse mode is stable, the number of local extrema in the $I_m$-I curve is also equal to that of local extrema in the $I_{ea}$-I curve, as shown in FIG. 5B for example. Hence, each of the numbers of local extrema in the $I_{ea}$-I curve and the $I_m$-I curve is compared with each other, and if both numbers coincide with each other, the transverse mode is regarded as being stable, and if not coincide, the transverse mode is regarded as being unstable. It should be noted that a local extremum can be identified as a value at which the sign of the derivative of the characteristic curve reverses. In the example of FIGS. 9A and 9B, the $I_{ea}$-I curve shown in FIG. 9A has one local extremum and the $I_m$-I curve shown in FIG. 9B has three local extrema. Since both numbers of local extrema do not coincide with each other, the semiconductor laser device having such a characteristic can be determined to be abnormal in the transverse mode.

Embodiment 4

Figure 10A:
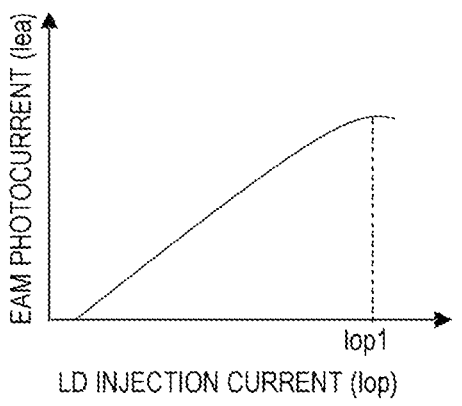
FIGS. 10A and 10B are graphs for explaining an inspection method for semiconductor laser device according to Embodiment 4.
Figure 10B:
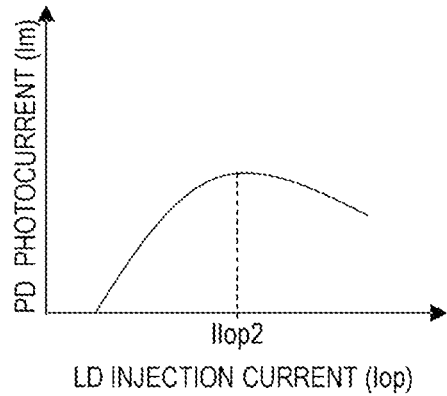

FIGS. 10A and 10B are graphs for explaining an inspection method for semiconductor laser device according to Embodiment 4, in which an $I_{ea}$-I curve, the total light output characteristic (FIG. 10A) and an $I_m$-I curve, the transverse-mode light output characteristic (FIG. 10B) are shown that are acquired when the semiconductor laser device under inspection is abnormal in the transverse mode. As shown in FIGS. 10A and 10B, a local extremum due to saturation appears in the $I_{ea}$-I curve, and a local extremum due to the transverse mode becoming unstable may sometimes appears in the $I_m$-I curve at an injection current $I_{op}$ smaller than the injection current $I_{op}$ corresponding to the local extremum of the $I_{ea}$-I curve. When the transverse mode is stable, the local extremum of the $I_m$-I curve appears also at the same value of the $I_{op}$ as the local extremum of the $I_{ea}$-I curve. Hence, the values of the $I_{op}$ at which the respective local extrema appear in the $I_{ea}$-I curve and the $I_m$-I curve are measured, and if both values coincide with each other, the transverse mode can be regarded to be stable, and if not coincide, the transverse mode can be regarded to be unstable. In the example of FIGS. 10A and 10B, the injection currents $I_{op}$ at which the local extrema appear in the $I_{ea}$-I curve and the $I_m$-I curve are designated at $I_{op1}$ and $I_{op2}$, respectively. If the $I_{op1}$ and the $I_{op2}$ coincide with each other, the semiconductor laser device under inspection may be determined to be acceptable because the transverse mode is stable. If the $I_{op1}$ and the $I_{op2}$ do not coincide with each other, on the other hand, the semiconductor laser device under inspection is determined to be abnormal in the transverse mode.

Since the $I_m$-I curve shown in FIG. 9B of Embodiment 3 has the plurality of local maxima, the positions of the local maxima are difficult to determine. On the other hand, since the $I_m$-I curve shown in FIG. 10B has one local extremum, the semiconductor laser device having such a characteristic cannot be determined to be abnormal in the transverse mode using the abnormal transverse-mode determination method described in Embodiment 3. Hence, the abnormal transverse mode is preferably determined by combined use of the inspection methods described in Embodiments 3 and 4.

Embodiment 5

Figure 11A:
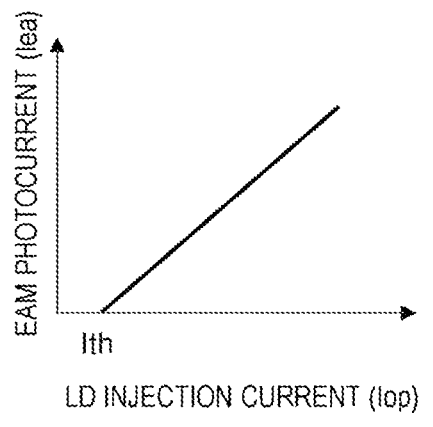
FIGS. 11A, 11B, 11C, 11D, and 11E are graphs for explaining an inspection method for semiconductor laser device according to Embodiment 5.
Figure 11B:
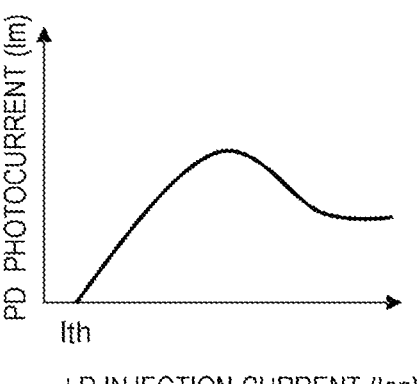
Figure 11C:
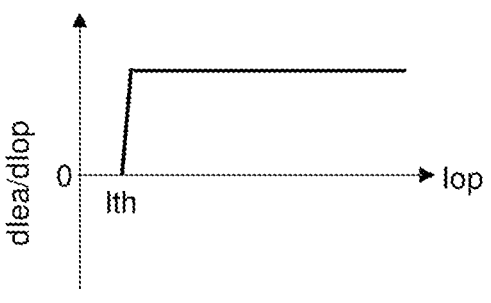
Figure 11D:
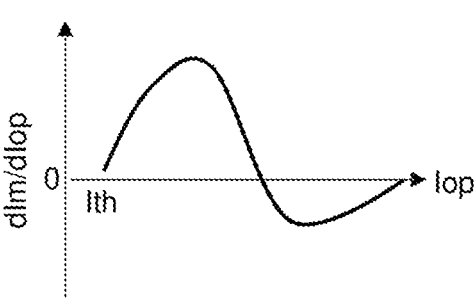
Figure 11E:
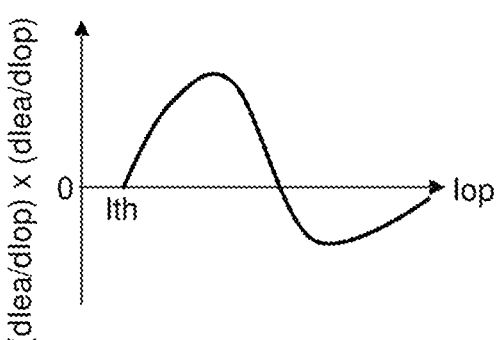

FIGS. 11A to 11E are graphs for explaining an inspection method for semiconductor laser device according to Embodiment 5. FIG. 11A and FIG. 11B respectively show an $I_{ea}$-I curve, the total light output characteristic and an $I_m$-I curve, the transverse-mode light output characteristic that are acquired when the semiconductor laser device under inspection is unstable in the transverse mode. FIG. 11C shows a curve of the derivative values of the $I_{ea}$-I curve; FIG. 11D shows a curve of the derivative values of the $I_m$-I curve; and FIG. 11E shows a curve of the product values of the derivative values of the $I_{ea}$-I curve and the derivative values of the $I_m$-I curve. In Embodiment 5, the products of the derivative values of each of the $I_{ea}$-I curve and the $I_m$-I curve are calculated, to determine the transverse mode to be stable when the products have positive signs and to be unstable when the products have negative signs, in a current range higher than a threshold current $I_{th}$ that is an injection current at which the LD 1 begins lasing.

For example, if the transverse mode is stable and both of the $I_{ea}$-I curve and the $I_m$-I curve have similar linear shapes, the products of the derivative values always take positive values in the current range higher than the $I_{th}$. However, when the transverse mode is unstable and the $I_m$-I curve has a nonlinear shape different from the $I_{ea}$-I curve as shown in FIG. 11B, the products of the derivative values of both curves do not always take positive values in a current range higher than the $I_{th}$ but a current range appears therein in which the products take negative values as shown in FIG. 11E. The semiconductor laser device having such a characteristic of the products can be determined to be abnormal in the transverse mode.

According to Embodiment 5, a merit is brought about that is able to determine the transverse mode to be abnormal for both the case of the number of extrema being different between the $I_{ea}$-I curve and the $I_m$-I curve as described in Embodiment 3 and the case of the number of extrema being the same between the $I_{ea}$-I curve and the $I_m$-I curve but the local extremum position being different therebetween as described in Embodiment 4.

Embodiment 6

Figure 12:
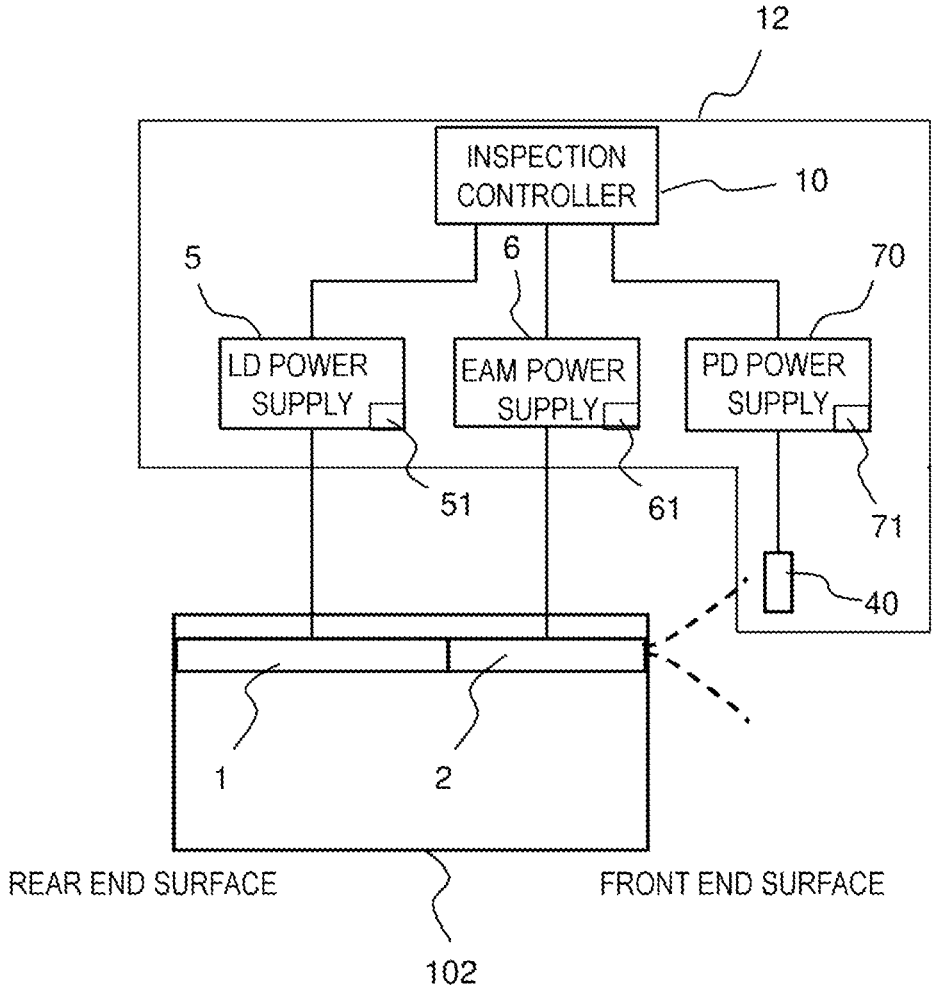
FIG. 12 is a schematic diagram showing a configuration of an inspection device for semiconductor laser device and a semiconductor laser device under inspection, according to Embodiment 6.

FIG. 12 is a schematic diagram showing a configuration of an inspection device 12 for semiconductor laser device and a semiconductor laser device 102 under inspection, according to Embodiment 6. Embodiment 6 is for inspecting the semiconductor laser device 102 that is provided with no photodetector. The semiconductor laser device 102 is monolithically integrated with the semiconductor laser (LD) 1 and the electroabsorption modulator (EAM) 2, and their both optical waveguides are coupled to each other. Since the semiconductor laser device 102 is provided with no photodetector, the inspection device 12 is provided with a photodetector (PD) 40 that is disposed at a position for receiving only part of the spatially distributed laser light, i.e., part of the transverse-mode laser light output from the semiconductor laser device 102. The PD 40 is controlled by a PD power supply 70 provided with the photocurrent detector 71.

With this configuration, the photocurrent output from the PD 40 behaves similarly to the photocurrent $I_m$ of the photodetector (PD) 4 described in Embodiment 1 and Embodiments 3 to 5. Hence, using the same technique described in Embodiment 1 and Embodiments 3 to 5, it is possible to determine the semiconductor laser device 102 to be abnormal in the transverse mode by comparing the photocurrent $I_{ea}$ of the EAM 2 with the photocurrent $I_m$ of the PD 40.

According to Embodiment 6, although the inspection device 12 for semiconductor laser device needs one photodetector, the total light output characteristic of the semiconductor laser device 102 under inspection provided with no photodetector but with the EAM 2 can be acquired by measuring the photocurrent of the EAM 2. Consequently, it is possible to determine precisely whether or not the semiconductor laser device under inspection is abnormal in the transverse mode by comparing the total light output characteristic with the transverse-mode light output characteristic.

Embodiment 7

Figure 13:
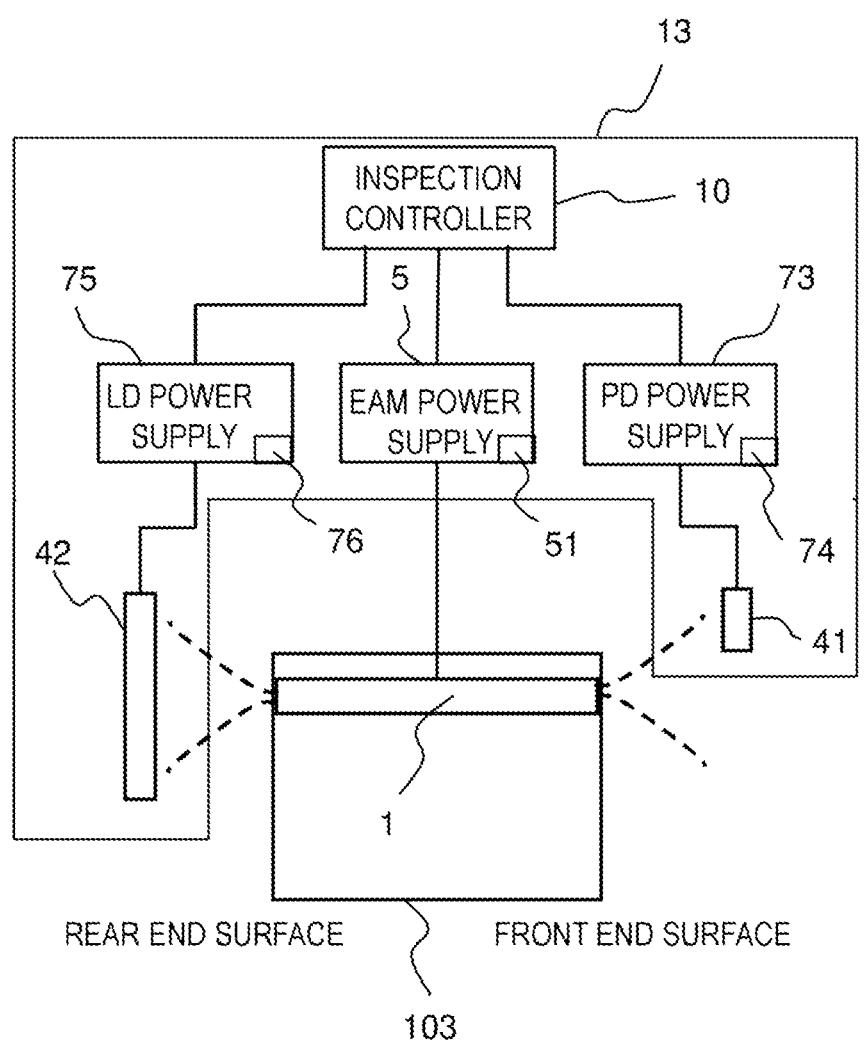
FIG. 13 is a schematic diagram showing a configuration of an inspection device for semiconductor laser device and a semiconductor laser device under inspection, according to Embodiment 7.

FIG. 13 is a schematic diagram showing a configuration of an inspection device 13 for semiconductor laser device and a semiconductor laser device 103 under inspection, according to Embodiment 7. Embodiment 7 is for inspecting the semiconductor laser device 103 that is provided with neither electroabsorption modulator (EAM) nor photodetector (PD) but provided only with the semiconductor laser (LD) 1 as an emission element. Since the semiconductor laser device 103 under inspection is provided with no photodetector, the inspection device 13 is provided with a first photodetector (first PD) 41 that is disposed at a position for receiving only part of the spatially distributed laser light, i.e., part of the transverse-mode laser light emitted from the front end surface of the semiconductor laser device. The inspection device is further provided with a first PD power supply 73 that applies a reverse bias voltage to the first PD 41 and has a photocurrent detector 74. Moreover, since the semiconductor laser device 103 under inspection is provided with no EAM, the inspection device 13 is provided with a second photodetector (second PD) 42 that is disposed at a position for receiving the total laser light emitted from the rear end surface of the semiconductor laser device. The inspection device is further provided with a second PD power supply 75 that applies a reverse bias voltage to the second PD 42 and has a photocurrent detector 76.

Figure 14:
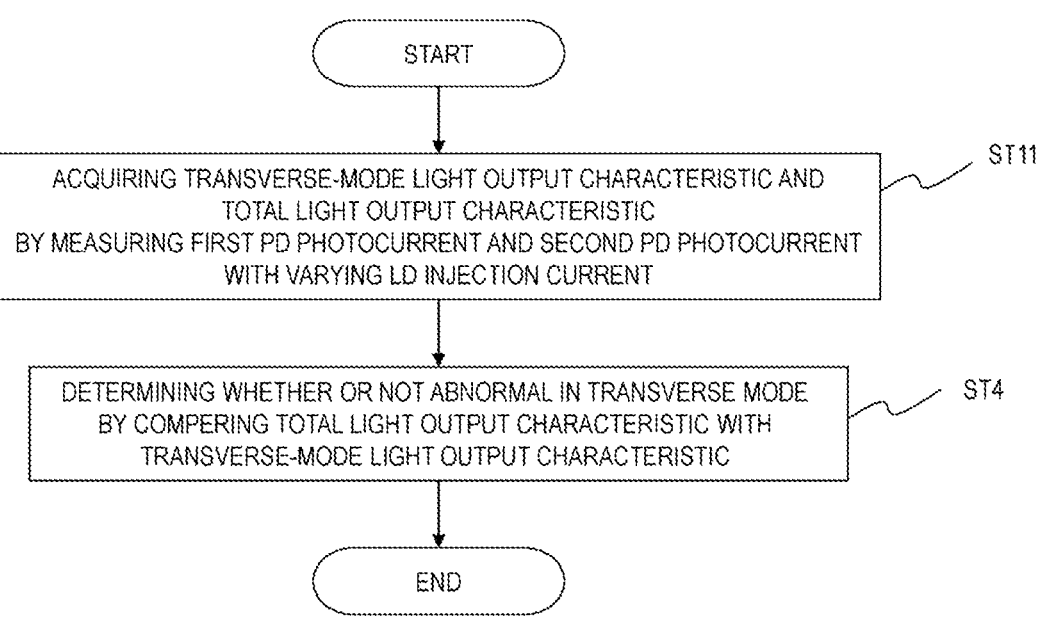
FIG. 14 is a flow diagram for explaining a procedure of an inspection method for semiconductor laser device according to Embodiment 7.

With the above configuration, the photocurrent output from the PD 41 behaves similarly to the photocurrent $I_m$ of the PD 4 as described in Embodiment 1 and Embodiments 3 to 5. Also, the photocurrent output from the PD 42 behaves similarly to the photocurrent $I_{ea}$ of the EAM 2 as described in Embodiment 1 and Embodiments 3 to 5. Hence, the transverse-mode light output characteristic and the total light output characteristic can be acquired by measuring the photocurrents of the first PD 41 and the second PD 42 while varying the injection current $I_{op}$ to the LD 1 by the inspection controller 10 controlling the LD power supply 5, as shown by flow diagram of FIG. 14 (Step ST11). And, using the same technique described in Embodiment 1 and Embodiments 3 to 5, the transverse mode can be determined to be abnormal or not by comparing the total light output characteristic with the transverse-mode light output characteristic (Step ST4).

According to Embodiment 7, the inspection device 13 for semiconductor laser device, although needs two photodetectors, can precisely determine whether or not the semiconductor laser device 103 under inspection provided with neither EAM nor photodetector is abnormal in the transverse mode by comparing the total light output characteristic with the transverse-mode light output characteristic.

Although the present application is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments. It is therefore understood that numerous modifications which have not been exemplified can be devised without departing from the scope of the present application. For example, at least one of the constituent components may be modified, added, or eliminated. At least one of the constituent components mentioned in at least one of the preferred embodiments may be selected and combined with the constituent components mentioned in another preferred embodiment.

REFERENCE NUMERALS

1: semiconductor laser (LD);
2: electroabsorption modulator (EAM);

4, 40: photodetector (PD);
41: first PD;
42: second PD;
5: LD (semiconductor laser) power supply;
6: EAM (electroabsorption modulator) power supply;
7, 70: PD (photodetector) power supply;
73: first PD power supply;
75: second PD power supply;
31, 32: window structure;
11, 12, 13: inspection device for semiconductor laser device; and
100, 101, 102, 103: semiconductor laser device.

The invention claimed is:

1. An inspection method for semiconductor laser device adapted to inspect a semiconductor laser device integrated with a semiconductor laser, an electroabsorption modulator configured to receive as an input a laser light output from the semiconductor laser, and a photodetector fixed in a single position to detect a laser light intensity of a part of the laser light of the semiconductor laser output from the electroabsorption modulator, the inspection method comprising:

a step of acquiring a transverse-mode light output characteristic that is a relationship between an injection current to the semiconductor laser and a photocurrent output from the photodetector;

a step of applying a reverse bias voltage to the electroabsorption modulator and acquiring a total light output characteristic that is a relationship between the injection current to the semiconductor laser and a photocurrent output from the electroabsorption modulator while applying the reverse bias voltage to the electroabsorption modulator; and a step of comparing the total light output characteristic with the transverse-mode light output characteristic, and; and a step of determining whether or not the semiconductor laser device under inspection is abnormal in a transverse mode based on a result of comparing the total light output characteristic with the transverse-mode light output characteristic.

2. The inspection method for semiconductor laser device, of claim 1, wherein the semiconductor laser device under inspection has a window structure at a front end surface of the semiconductor laser device, and the photodetector is disposed at a position for receiving the part of the laser light diverging in the window structure.

3. The inspection method for semiconductor laser device, of claim 2, wherein the step of comparing includes comparing a number of local extrema of a characteristic curve of the transverse-mode light output characteristic with a number of local extrema of a characteristic curve of the total light output characteristic.

4. The inspection method for semiconductor laser device, of claim 2, wherein the step of comparing includes comparing a position of the injection current of a local extremum of a characteristic curve of the transverse-mode light output characteristic with a position of the injection current of a local extremum of a characteristic curve of the total light output characteristic.

5. The inspection method for semiconductor laser device, of claim 2, further comprising calculating products of derivative values of a characteristic curve of the transverse-mode light output characteristic and derivative values of a characteristic curve of the total light output characteristic, and the step of determining includes determining whether or not the semiconductor laser device under inspection is abnormal in the transverse mode based on the products.

6. The inspection method for semiconductor laser device, of claim 1, wherein the semiconductor laser device under inspection has a window structure at a rear end surface of the semiconductor laser device, and the photodetector is disposed at a position for receiving the part of the laser light diverging in the window structure.

7. The inspection method for semiconductor laser device, of claim 6, wherein the step of comparing includes comparing a number of local extrema of a characteristic curve of the transverse-mode light output characteristic with a number of local extrema of a characteristic curve of the total light output characteristic.

8. The inspection method for semiconductor laser device, of claim 6, wherein the step of comparing includes comparing a position of the injection current of a local extremum of a characteristic curve of the transverse-mode light output characteristic with a position of the injection current of a local extremum of a characteristic curve of the total light output characteristic.

9. The inspection method for semiconductor laser device, of claim 6, further comprising calculating products of derivative values of a characteristic curve of the transverse-mode light output characteristic and derivative values of a characteristic curve of the total light output characteristic, and the step of determining includes determining whether or not the semiconductor laser device under inspection is abnormal in the transverse mode based on the products.

10. The inspection method for semiconductor laser device, of claim 1, wherein the step of comparing includes comparing a number of local extrema of a characteristic curve of the transverse-mode light output characteristic with a number of local extrema of a characteristic curve of the total light output characteristic.

11. The inspection method for semiconductor laser device, of claim 1, wherein the step of comparing includes comparing a position of the injection current of a local extremum of a characteristic curve of the transverse-mode light output characteristic with a position of the injection current of a local extremum of a characteristic curve of the total light output characteristic.

12. The inspection method for semiconductor laser device, of claim 1, further comprising calculating products of derivative values of a characteristic curve of the transverse-mode light output characteristic and derivative values of a characteristic curve of the total light output characteristic, and the step of determining includes determining whether or not the semiconductor laser device under inspection is abnormal in the transverse mode based on the products.

13. An inspection device for semiconductor laser device configured to inspect a semiconductor laser device integrated with a semiconductor laser, an electroabsorption modulator configured to receive as an input a laser light output from the semiconductor laser, and a photodetector fixed in a single position to detect a laser light intensity of part of the laser light of the semiconductor laser output from the electroabsorption modulator, the inspection device comprising:

a semiconductor laser power source configured to supply an injection current to the semiconductor laser;

an electroabsorption modulator power supply configured to supply a reverse bias voltage to the electroabsorption modulator;

a photodetector power supply configured to supply a reverse bias voltage to the photodetector, and an inspection controller configured to acquire a transverse-mode light output characteristic that is a relationship between the injection current to the semiconductor laser and a photocurrent output from the photodetector and to acquire a total light output characteristic that is a relationship between the injection current to the semiconductor laser and a photocurrent output from the electroabsorption modulator while applying the reverse bias voltage to the electroabsorption modulator, and to compare the total light output characteristic with the transverse-mode light output characteristic, thereby to determine whether or not the semiconductor laser device under inspection is abnormal in a transverse mode.

14. The inspection device for semiconductor laser device, of claim 13, wherein the inspection controller is configured to compare a number of local extrema of a characteristic curve of the transverse-mode light output with a number of local extrema of a characteristic curve of the total light output characteristic, and determine whether or not the semiconductor laser device under inspection is abnormal in the transverse mode based on a result of comparing the number of local extrema of the characteristic curve of the transverse-mode light output with the number of local extrema of the characteristic curve of the total light output characteristic.

15. The inspection device for semiconductor laser device, of claim 13, wherein the inspection controller is configured to compare a position of the injection current of a local extremum of a characteristic curve of the transverse-mode light output characteristic with a position of the injection current of a local extremum of a characteristic curve of the total light output characteristic, and determine whether or not the semiconductor laser device under inspection is abnormal in the transverse mode based on a result of comparing the position of the local extremum of the characteristic curve of the transverse-mode light output characteristic with the position of the local extremum of the characteristic curve of the total light output characteristic.

16. The inspection device for a semiconductor laser device, of claim 13, wherein the inspection controller is configured to calculate products of derivative values of a characteristic curve of the transverse-mode light output characteristic and derivative values of a characteristic curve of the total light output characteristic, and determine whether or not the semiconductor laser device under inspection is abnormal in the transverse mode based on the products.

17. An inspection method for semiconductor laser device adapted to inspect a semiconductor laser device integrated with a semiconductor laser and an electroabsorption modulator configured to receive as an input a laser light output from the semiconductor laser, the inspection method comprising:

a step of acquiring a transverse-mode light output characteristic that is a relationship between an injection current to the semiconductor laser and a photocurrent output from a photodetector fixed in a single position to detect a laser light intensity of a part of the laser light of the semiconductor laser output from the electroabsorption modulator;

a step of applying a reverse bias voltage to the electroabsorption modulator and acquiring a total light output characteristic that is a relationship between the injection current to the semiconductor laser and a photocurrent output from the electroabsorption modulator while applying the reverse bias voltage to the electroabsorption modulator;

a step of comparing the total light output characteristic with the transverse-mode light output characteristic; and a step of determining whether or not the semiconductor laser device under inspection is abnormal in a transverse mode based on a result of comparing the total light output characteristic with the transverse-mode light output characteristic.

* * * * *